United States Patent [19]

Makkaev et al.

[11] Patent Number: 4,576,689
[45] Date of Patent: Mar. 18, 1986

[54] PROCESS FOR ELECTROCHEMICAL METALLIZATION OF DIELECTRICS

[76] Inventors: Almaxud M. Makkaev, ulitsa Zolotodolinskaya, 29, kv. 308, Novosibirsk; Oleg I. Lomovsky, ulitsa Ostrovskogo, 101a, kv. 22, Berdsk Novosibirskoi oblasti; Jury I. Mikhailov, ulitsa Maltseva, 1, kv. 31; Vladimir V. Boldyrev, ulitsa Tereshkovoi, 38, kv. 29, both of Novosibirsk, all of U.S.S.R.

[21] Appl. No.: 243,929

[22] PCT Filed: Apr. 25, 1980

[86] PCT No.: PCT/SU80/00063
§ 371 Date: Feb. 18, 1981
§ 102(e) Date: Feb. 18, 1981

[87] PCT Pub. No.: WO80/02570
PCT Pub. Date: Nov. 27, 1980

[51] Int. Cl.$^4$ .................. C25D 5/54; C23C 18/14
[52] U.S. Cl. ........................ 204/20; 204/30; 204/38.4; 427/42; 427/97; 427/98; 427/383.1; 427/437; 427/443.1
[58] Field of Search .................. 204/20, 30, 38 B; 106/1.23, 1.26; 427/42, 437, 443.1, 383.1, 96, 97, 98

[56] References Cited

U.S. PATENT DOCUMENTS

| | | | |
|---|---|---|---|
| 3,046,159 | 7/1962 | Brookshire | 427/437 |
| 3,307,972 | 3/1967 | Ehrhardt | 427/437 |
| 3,716,462 | 2/1973 | Jensen | 204/38 B |
| 3,994,727 | 11/1976 | Polichette | 96/38.4 |
| 4,209,331 | 6/1980 | Kukanskis et al. | 106/1.23 |

*Primary Examiner*—John F. Niebling
*Assistant Examiner*—William T. Leader
*Attorney, Agent, or Firm*—Burgess, Ryan & Wayne

[57] ABSTRACT

A solution for electrochemical metallization of dielectrics comprising a salt of copper, a phosphorus-containing salt, a stabilizing agent and water which contains, as the phosphorus-containing salt, a salt of hypophosphorous acid, the components being employed in the following proportions, g/l:
copper salt: 35 to 350
hypophosphorous acid salt: 35 to 400
stabilizing agent: 0.004 to 250
water: up to 1 liter.

A process for electrochemical metallization of dielectrics involving preparation of the dielectric surface, formation of a current-conducting layer thereon, electrochemical building-up of a metal coating, characterized in that the dielectric surface activation and formation of a current-conducting layer on this surface are effected simultaneously by wetting the dielectric surface with the above-specified solution, followed by a heat-treatment at a temperature within the range of from 80° to 350° C.

13 Claims, No Drawings

PROCESS FOR ELECTROCHEMICAL METALLIZATION OF DIELECTRICS

FIELD OF THE INVENTION

The present invention relates to the art of electrochemical metallization and, more particularly, to a solution and a process for electrochemical metallization of dielectrics.

BACKGROUND OF THE INVENTION

Known in the art and extensively employed for electrochemical metallization of dielectrics are solutions having various compositions. Thus, use is made of solutions of surfactants for surface degreasing, i.e. imparting hydrophilic properties thereto; acid solutions of tin chloride to sensitize the surface; solutions of palladium chloride for activation of the surface, i.e. deposition, on the dielectric surface, of metallic palladium particles which catalyze the process of chemical copper plating; solutions for chemical copper-plating for application, onto the dielectric surface, of a thin (1 to 3 μm) current-conducting layer; solutions of electrolytes for electroplating build-up of a metal layer of a required thickness (cf. USSR Inventor's Certificate No. 240061, published 21.03.1969, Bulletin No. 12, Cl. H 05 K 3/06).

Known in the art are also modifications of the above-mentioned combination of solutions characterized, in particular, in that for the surface activation use is made of salts of noble metals (gold, silver, platinum and the like) and a current-conducting layer of other metals (nickel, cobalt, iron and the like) is chemically deposited onto the activated surface. Accordingly, the solutions for chemical metallization are also different and consist of a salt of a reducible metal (copper, nickel, cobalt, iron and the like), a reducing agent (sodium boron hydride, formaldehyde, hydrazine and the like) and a stabilizer—a solution of a complex-forming agent for the metal ions (citric acid, Seignette salt and the like), or a surface-active substance (dodecylaminacetate and the like) (cf. U.S. Pat. Nos. 3,515,649 of June 2, 1970; Int. Cl. C 23f 17/00; US Cl. 204-38; 3,553,085 published Jan. 5, 1971; Int. Cl. C23 d 5/60, US Cl. 204-30; 3,764,488 published Oct. 9, 1973, Int. Cl. B 44 d 1/09, US Cl. 240-381.3; 3,563,784 published Oct. 16, 1971, Int. Cl. C 23c 3/00, US Cl. 117-47).

Also known is a solution for electrochemical metallization of dielectrics employed for the surface activation before a chemical metallization and having the following composition: $PdCl_2$—0.5-1.0 g/l; $H_2SO_4$—40-200 ml/l; $SnCl_2$—30-50 g/l; HCl—10-50 ml/l (U.S. Pat. No. 3,650,913 published Mar. 21, 1972; Int.Cl. C 23b 50/60, US Cl. 204-30).

Also known is a combination of solutions for electrochemical metallization of through holes of multi-layer printed boards which differs from those specified hereinbefore by the additional use of a hydrochloric-acid solution of rhodium chloride prior to the activation of the surface of the hole walls which has the following composition: rhodium chloride—4.5-5 g/l; hydrochloric acid—250-200 mg/l (cf. USSR Inventor's Certificate No. 470940, published May 15, 1975, Bulletin No. 18, Int.Cl. H 05K (3/00).

All the above-mentioned solutions for electrochemical metallization contain economically inefficient and difficult-to-obtain substances such as salts of noble metals (palladium, gold, silver, platinum, rhodium), stabilizing agents such as citric acid and Seignette salt. The above-discussed prior art solutions for electrochemical metallization have low stability, thus necessitating frequent correction and replacement. These solutions adapted for electrochemical metallization do not ensure a required quality of application of chemical coatings and an adequate reproducibility thereof.

Also known in the art is a solution for electrochemical metallization of dielectrics which has the following composition, g/l: copper salt (as calculated for metallic copper)—35-40; potassium pyrophosphate—450-500; ammonia—3-6; citric acid—10-20 (cf. USSR Inventor's Certificate No. 159368 published 1963. Bulletin No. 24, Cl. C 23 B 5/18). This solution has but a weak activation power relative to dielectrics, wherefore it does not ensure a required quality of the current-conducting layer intended for electroplated building-up of a metal coating on the dielectric surface.

Known are different processes for electrochemical metallization of dielectrics which have found an extensive use in the art.

Thus, electrochemical metallization of dielectrics is effected in the following manner. The surface is degreased and washed with water. Then the surface is activated, prior to the deposition of the current-conducting layer, by treatment thereof with a solution of tin chloride, washing, followed by treatment with a solution of palladium chloride and washing. As a result of such activation, on the surface there are formed particles of metallic palladium which serve as initiators of a chemical copper-plating process. After the latter chemical copper-plating there is effected the formation of the current-conducting layer on the dielectric surface. After the subsequent washing, the coating of the required thickness is obtained by electroplating build-up of the metal. In this manner, the combination of successive operations constituting this process is as follows: degreasing, washing, activation, formation of a current-conducting layer (by chemical copperplating), washing, electroplating build-up of the coating (cf. USSR Inventor's Certificate No. 240061, published Mar. 21, 1969, Bulletin No. 12, Cl. H 05 K 3/06).

Another prior art process for electrochemical metallization of dielectrics differs form the above-described in that the surface activation is carried out with the use of a combined solution of tin chloride and palladium chloride which makes it possible to combine operations of sensitization and activation into one operation and avoid one washing operation (cf. U.S. Pat. No. 3,650,913 published Mar. 21, 1972, Int.Cl. C 23 B 5/60, US Class 205-30).

The above-mentioned processes for electrochemical metallization of dielectrics are complicated due to their multistage character, long duration of the process, necessity of preparation and frequent correction of unstable solutions of tin chloride, combined activation solutions, solutions of chemical metallization, necessity of utilization of wastes of precious metals of palladium and rhodium, increased labour-consumption and unsatisfactory reproducibility of chemical metallization processes. Furthermore, these processes contemplate the use of economically inefficient and difficult-to-obtain substances such as salts of palladium, gold, silver, platinum, rhodium, citric acid, Seignette salt and the like.

Also known is a process for electrochemical metallization employed for metallization of walls of through holes in multi-layered printed boards which, in addition to the operations of the above-discussed processes, has an operation of the surface treatment in a hydrochloric-acid solution of rhodium chloride after operations of degreasing and washing. The purpose of this operation is as follows. If metallization is carried out by this process, then in the treatment of hole walls in the solution of palladium chloride there occurs a contact formation of a film of palladium metal on end faces of copper contact plates. This palladium film during manufacture and use of a printed board effectively absorbs hydrogen while being transformed into palladium hydride—a brittle and non-conducting material—which results in breaking of the mechanical and electric contact and the board gets inoperative. The introduction of the operation of treatment of wall of holes in a solution of rhodium chloride makes it possible to deposit, on end faces of a copper foil, a protective film of metallic rhodium preventing the future formation of a film of palladium. (Cf. USSR Inventor's Certificate No. 470940 published May 15, 1975, Bulletin No. 18, Int.Cl. H 05 K 3/00).

This process, likewise those described hereinabove, is multi-staged, consisting of long-duration operations necessitating correction of unstable solutions of tin chloride, combined activation solution, solutions of chemical metallization, necessity of utilization of wastes of precious metals: palladium and rhodium. Furthermore, this process does not provide for a high reliability of interlayer junctions in printed boards, since the adherence of the metallization layer with the dielectric surface of the hole wall ensures only a 3–5-time resoldering of holes.

DISCLOSURE OF THE INVENTION

The present invention is directed to the provision, by selection of a novel composition of a solution for electrochemical metallization of dielectrics and variation of steps of the process for electrochemical metallization, of an activating power of the solution; to the provision of a simplified procedure of electrochemical metallization of dielectrics and an increased adherence of the metal layer to the dielectric surface.

This object is accomplished by that the solution for electrochemical metallization of dielectrics comprising a copper salt, a phosphorus-containing salt, a stabilizer and water, according to the present invention contains, as the phosphorus-containing salt, a salt of hypophosphorous acid at the following proportions of the components, g/l:
copper salt: 35 to 350
salt of hypophosphorous acid: 35 to 400
stabilizer: 0,004 to 250
water: up to 1 liter.

For a more uniform crystallization of metallic copper on the dielectric surface, this solution can additionally contain an alkali metal phosphate in an amount of from 1 to 14 g/l. Furthermore, the solution for electrochemical metallization of dielectrics can additionally contain ammonium fluoride in an amount of from 2 to 36 g/l. In the presence of this additive of ammonium fluoride the process can be effected with the formation of a current-conducting layer on the dielectric surface at a lower temperature. The solution for electrochemical metallization of dielectrics can also contain an alkali metal phosphate in an amount of from 1 to 14 g/l and ammonium fluoride in an amount of from 2 to 36 g/l thus enhancing the activation power of the solution.

The object of the present invention is also accomplished by that in a process for electrochemical metallization of dielectrics involving preparation of the dielectric surface, activation of the dielectric surface, creation of a current-conducting layer thereon, electrochemical build-up of a metal coating, according to the present invention the dielectric surface activation and creation of a current-conducting layer on this surface are effected simultaneously by wetting the dielectric surface with the above-mentioned solution, followed by a heat-treatment at a temperature within the range of from 80° to 350° C. The heat-treatment is preferably carried out by irradiation with IR-rays at a temperature of from 220° to 270° C. for 7 to 20 seconds. It is advisable to carry out the heat-treatment also by a combined irradiation by IR- and UV-rays at a temperature within the range of from 180° to 220° C. for 5 to 12 seconds.

To increase electrical conductivity of the current-conducting layer after the heat-treatment, it is also possible to carry out a chemical copper-plating of the dielectric surface.

The solution for electrochemical metallization of dielectrics according to the present invention possesses an increased activation power.

The process according to the present invention makes it possible to simplify the procedure of manufacture, increase adherence of the metal layer to the dielectric surface. The solution and process according to the present invention for electrochemical metallization ensures a higher quality, as compared to the prior art solutions and processes, of applied, coatings, especially in electrochemical metallization of through holes of printed boards, as well as in a series of applications, wherein known solutions and processes turn to be inapplicable, for example in metallization of piezoceramics.

BEST MODE FOR CARRYING-OUT THE INVENTION

The solution according to the present invention contains ions of copper (strong oxidizing agent) and hypophosphite-ions (strong reducing agent). As copper salts use can be made of any well-soluble in water copper salts such as copper sulphate, copper selenate, copper nitrate and the like.

As the salts of hypophosphorous acid use can be made of such salts as sodium hypophosphite, potassium hypophosphite, aluminium hypophosphite and the like.

The quantitative proportions of the above-mentioned components of the solution according to the present invention make it possible to ensure the highest activation power of the solution. The solution according to the present invention can be prepared by way of a conventional dissolution of the components in distilled water at room temperature in the succession specified hereinabove.

The solution contains a stabilizing agent to avoid the oxidizing-reducing interaction. As the stabilization agent for the solution according to the present invention use can be made of such complex-forming agents for copper ions as triethylenediamine, ethylenediamine, ammonia, glycerol and the like. The stabilizing effect of such complex-forming agents resides in that they hinder the transfer of electrons from hypophosphite ions to copper ions. On the other hand, as the stabilizers for the solution according to the present invention use can be made of surfactants such as dodecylaminacetate. Such stabilizing agents cannot hinder the direct transfer of electrons from hypophosphite ions to ions of the reducing agent. However, this process, if it can occur, is autocatalytic in its nature, i.e. the formed particles of metallic copper becomes centres initiating and accelerating this process. The stabilizing effect of similar surfactants consists in that they passivate the copper particles originating in the solution and hinder the shifting of the reduction-oxidation to the autocatalytic process.

Therefore, the solution containing ions of copper and hypophosphite-ions is rather stable at room temperature in the presence of stabilizing agents; however, it is metastable.

Upon heating of a dielectric wetted with this solution the process of copper reduction takes place due to activation of chemical transformations so that crystallization of metallic copper is developed on the dielectric surface, first of all on the surface deficiencies such as pores, crackings and the like, thus ensuring, eventually, the attained strength of adherence.

In the presence of an additive of phosphates of alkali metals (sodium and potassium phosphates and the like) there is a more uniform filling of the surface, while the additive of ammonium fluoride makes it possible to carry out the process of the formation of the current-conducting layer on the dielectric surface at a lower temperature.

The process of the formation of a current-conducting layer on the dielectric surface can be carried out within a wide temperature range, the most effective is the heat-treatment under the effect of IR-irradiation at a temperature of from 220° to 270° C. for 7 to 20 seconds. The most advantageous result is attained at a combined effect of IR- and UV-radiations at a temperature within the range of from 180° to 220° C. for 5 to 12 seconds, since UV-radiation additionally promotes chemical transformations.

As a result of the heat-treatment of the dielectric surface wetted with the above-indicated solution, a black residue of particles of a finely-divided metallic copper is formed on the dielectric surface. Because of specific properties of the finely-dispersed metal such surface, under the conditions of the applied electric field, becomes electrically conductive despite the possible absence of an intimate mechanical contact of such particles. This provides for the possibility of a direct electroplating build-up of a metal coating of the required thickness while avoiding the operation of a chemical copper-plating. However, due to the same specificity of the metal properties in the state of a high dispersity the particles of metallic copper formed at the surface after the heat-treatment can serve as a catalyst for the process of a chemical copper-plating. This enables, when required, a chemical copper-plating of the dielectric surface after the heat-treatment and washing in order to increase electrical conductivity of the current-conducting layer thus providing a favourable result upon a further electroplating build-up of a metal layer of the required thickness. The formation, on the dielectric surface of a current-conducting layer makes it possible to ensure electrodeposition and build-up of various metals from appropriate electrolytes.

The efficiency of use of the solution and the process according to the present invention for electrochemical metallization can be illustrated by an example of a specific process of metallization of walls or through holes of printed boards as the most crucial problem in the art of metallization of dielectrics.

The electrochemical metallization of walls of through holes in printed boards is carried out in the following manner. From a foiled glass-cloth-base laminate blanks are cut according to the board size, a photoresist is then applied thereonto, the thus-masked plates are then exposed, coated with the protective varnish and through holes are drilled following the circuit pattern, the hole walls are degreased and washed. Then the hole walls are wetted with the solution according to the present invention, whereafter the heat-treatment is effected by preferably IR-radiation or combination of IR- and UV-radiation until the hole walls in printed boards become black in colour and then washed. After washing, a metal layer is built-up electrochemically on the hole walls to the required thickness. This process for electrochemical metallization of through holes of printed boards has the following advantages over the prior art.

First of all, the process of electrochemical metallization of through holes of printed boards becomes substantially simplified. This simplification is associated with a reduced number of process steps, lowered duration of the process (time necessary for the preparation of the holes for the electrochemical build-up of the coating is reduced from 35-40 minutes to 2-15 minutes depending on the heat-treatment conditions), elimination of the necessity of preparation, use, correction and utilization of wastes of various solutions upon activation of walls of the holes and chemical copper-plating thereof. The elimination of the operation of chemical copper-plating makes it possible, in a mass-production plant, to reduce the size of the production line of metallization of through holes from 20 to 8 m, thus saving production floor areas and number of operating personnel.

Secondly, adherence of the metal coating to the hole walls is improved. The process according to the present invention alleviates the problems of process reliability of adherence of the metal coating with the end faces of copper contact plates, since the use of palladium salts is avoided. On the other hand, the process ensures an increased strength of adherence of the metal with the dielectric surface of the hole walls. The results of tests of the adherence of a metallized piston with the hole walls have shown that holes in the boards enable a 12-15-time resoldering, whereas boards metallized by the prior art process permit only a 3-5-time resoldering.

Thirdly, the process according to the present invention avoids the use of economically inefficient and difficult-to-obtain substances employed in the prior art process.

For a better understanding of the present invention some specific examples illustrating the solution and process for electrochemical metallization of dielectrics are given hereinbelow.

EXAMPLE 1

Use is made of a solution for electrochemical metallization of dielectrics which has the following composition, g/l:
copper sulphate: 350
sodium hypophosphite: 400
triethylenediamine: 180.

The solution is prepared by dissolution of the components in distilled water in the above-specified sequence. The solution is used for electrochemical metallization of walls of through holes of printed boards for the creation of a current-conducting layer on the wall surface prior to the electrochemical build-up.

The manufacture of printed boards is performed in the following sequence: from a foiled glass-cloth-base laminate blanks are cut out according to the board size with a margine of 15 mm, a photoresist is applied thereonto and exposed; a protective varnish is then applied and holes are made according to the circuit pattern; the hole walls are degreased in a surfactant solution and washed. The formation of a current-conducting layer on the surface of the hole walls is effected in the following manner; the blanks are wetted with the above mentioned solution for 0.5 minute; the heat-treatment with IR-radiation is effected for 20 seconds at the temperature of 220° C. until the walls of the printed board holes get black, washed in running cold water. Thereafter the protective varnish is removed; onto the hole walls and current-conducting following conditions:

the composition of the electrolyte, g/l copper sulphate: 230
sulphuric acid (specific gravity of 1.84): 60
ethanol: 10
current density: 3–4 A/dm$^2$
time of electrochemical copper-plating is 60 minutes, the copper layer thickness is 30 μm, temperature of the solution is within the range of from 18° to 25° C.

Thereafter, a protective silver coating is electrochemically deposited to the thickness of 12 μm, copper is etched from the spacing regions and then the final machining of the boards is carried out.

As a result of electrochemical metallization on the surface of hole walls in printed boards there is deposited a dense, uniform fine-crystalline bright pink layer. The adherence of the metal to the surface of the hole walls ensures the possibility of at least 12-time resoldering of the holes which satisfies the requirements to the metallized holes of printed circuit boards.

EXAMPLE 2

Use is made of a solution for electrochemical metallization having the following composition, g/l:
copper selenate: 180
sodium hypophosphite: 160
glycerol: 90
ammonium fluoride: 36.

The solution is prepared by dissolution of the components in distilled water in the above-indicated sequence. The solution is employed for electrochemical metallization of walls of through holes of printed circuit boards upon the formation of a current-conducting layer on the wall surface prior to metallization by electroplating. The manufacture of a printed board is effected similarly to Example 1 hereinabove. The formation of a current-conducting layer on the surface of the hole walls is effected in the following manner: a blank is wetted with the above-mentioned solution for 1 minute, then the heat-treatment with IR-radiation is carried out for 7 seconds at the temperature of 270° C. until the hole walls are black, washed in running water. Then, with the view to increase electrical conductivity of the current-conducting layer, chemical copper-plating of the hole walls is effected in a known solution of the following composition, g/l:
copper sulphate: 60
sodium-potassium tartrate: 180
caustic soda: 50
sodium carbonate: 46
nickel chloride: 3
formaldehyde: 15
for 5 minutes at the temperature of 20° C.

Afterwards, the manufacture of a printed board is effected in a manner similar to that described in the foregoing Example 1.

As a result of electrochemical metallization, on the surface of hole walls of printed boards there is deposited a dense, uniform, fine-crystalline layer having bright-pink colour. The adherence of the metal layer to the surface of the hole walls provides for the possibility of at least 12-time resoldering which quite satisfies the requirements to metallized holes of printed circuit boards.

EXAMPLE 3

A solution for electrochemical metallization or dielectrics has the following composition, g/l:
copper sulphate: 35
potassium hypophosphite: 35
dodecylaminacetate: 0.004.

The solution is prepared by dissolution of the components in distilled water in the above-specified succession.

The solution is employed for electrochemical metallization of both walls of through holes and the surface of a printed board in the manufacture thereof by the semi-additive method.

The manufacture of a printed board by the semi-additive method is effected in the following manner. A blank with drilled holes made of glass-cloth-base laminate coated with an adhesive of epoxyrubber is degreased by washing with dimethylformamide for 30 minutes; the adhesive is etched for 2 minutes at the temperature of 20° C. in a solution containing, g/l:
chromic anhydride: 950
sulphuric acid: 85.5
ferric sulphate: 3,
and washed with water. The formation of a current-conducting layer on the surface of the hole walls and on the board is performed in the following manner. The blank is wetted with the above-mentioned solution for 2 minutes and heat-treated by IR-radiation at the temperature of 250° C. for 15 seconds until the hole walls and the board surface become black, whereafter the blank is rinsed. In order to increase electrical conductivity of the current-conducting layer, chemical copper-plating of the hole walls and the board surface is effected in a known solution having the following composition, g/l:
copper sulphate: 35
potassium-sodium tartrate: 60
sodium hydroxide (caustic soda): 50
sodium carbonate: 30
33% formalin: 20–30 ml/l.

The time of chemical copper-plating is 30 minutes, the temperature is 20° C. The board is rinsed with water and build-up of a copper layer is effected electrochemically on the hole walls and the board surface. A further manufacture of a printed circuit board is carried out by conventional techniques.

As a result of electrochemical metallization, on the surface of the hole walls and the board there is deposited a uniform, dense and fine-crystalline layer having bright pink colour. The adherence of the metal layer to the surface of the hole walls ensures the possibility of at least 12-time resoldering which quite satisfies the requirements to metallized holes of printed boards. The adherence of the metal layer with the board surface is 380–420 g/3 mm which is superior to the adherence attained in known processes for electrochemical metallization of dielectrics.

EXAMPLE 4

A solution for electrochemical metallization of dielectrics has the following composition, g/l:
copper nitrate: 280
potassium hypophosphite: 240
ammonia: 235
potassium phosphate: 14
ammonium fluoride: 2.

The solution is prepared by dissolution of the components in distilled water in the above-specified succession. The solution is employed for electrochemical metallization of piezoceramic. To this end, a piezoceramic board made of barium titanate is degreased in a surfactant solution and rinsed. The formation of a current-conducting layer on this piezoceramic board is effected in the following manner: the board is wetted with the above-mentioned solution for 20 seconds and subjected to the heat-treatment at the temperature of 80° C. for 10 minutes until the board surface becomes black, whereafter the board is rinsed with water.

Electrochemical building-up of copper onto the surface of the board is effected in a manner similar to that described in Example 1 hereinbefore.

As a result of electrochemical metallization, on the board surface there is deposited a dense, uniform, fine-crystal layer of a bright-pink colour. The adherence of the metal layer to the surface of the piezoceramic board is 400 to 430 g/3 mm.

EXAMPLE 5

A solution which is employed for electrochemical metallization of dielectrics has the following composition, g/l:
copper selenate: 110
ammonium hypophosphite: 100
ammonia: 150.

The solution is prepared by dissolution of the components in distilled water in the above-specified sequence. The solution is employed for electrochemical metallization of a glass ceramic in the formation of a current-conducting layer on the surface thereof prior to electrochemical building-up of a metal layer. To this end, a non-ground glass ceramic board is degreases in a surfactant solution and rinsed. The current-conducting layer on the board is created in the following manner: the board is wetted with the above-mentioned solution for 40 seconds and then subjected to the heat-treatment at the temperature of 200° C. by a combined exposure to IR- and UV-radiations for 10 seconds until the board surface becomes black, whereafter the board is rinsed with water.

The electrochemical building-up of the copper layer onto the board surface is effected in a manner similar to that described in Example 1 hereinbefore.

As a result of electrochemical metallization, on the glass ceramic board surface there is formed a dense, uniform, fine-crystalline layer having bright-pink colour. The adherence of the metal layer to the surface of the glass ceramic board is 460–480 g/3 mm.

EXAMPLE 6

A solution which is employed for electrochemical metallization of dielectric has the following composition, g/l:
copper sulphate: 50
potassium hypophosphite: 50
ethylenediamine: 34
dodecylaminacetate: 0.007
potassium phosphate: 14.

The solution is prepared by dissolution of the components in distilled water in the above-specified succession. The solution is employed for electrochemical metallization of cardboard in the formation of a current-conducting layer on the surface thereof prior to the electrochemical building-up of a metal layer. To this end, a cardboard plate is degreased in a surfactant solution and rinsed. The formation of the current-conducting layer on its surface is effected in the following manner: the plate is wetted with the abovementioned solution for 30 seconds and then subjected to a combined heat-treatment with IR- and UV-radiations at the temperature of 350° C. for 5 seconds until the plate surface becomes black, and then the plate is rinsed with water.

The electrochemical building-up of the metal layer on the plate surface is effected in a manner similar to that described in Example 1.

As a result of electrochemical metallization, on the cardboard surface a dense, uniform, fine-crystalline layer is deposited which has a bright-pink colour. The adherence of the metal layer to the surface of the cardboard plate is 350 to 370 g/3 mm.

EXAMPLE 7

A solution which is employed for electrochemical metallization of dielectrics has the following composition, g/l:
copper nitrate: 200
sodium hypophosphite: 190
ethylenediamine: 84
sodium phosphate: 1.

The solution is prepared by dissolution of the components in distilled water in the above-specified succession. The solution is employed for electrochemical metallization of an ebonite article in the formation of a current-conducting layer on the surface thereof prior to electrochemical building-up of a metal layer. To this end, an ebonite plate is subjected to sand-blasting to impart roughness to its surface, degreased in a solution of a surfactant and rinsed. The formation of a current-conducting layer on the plate surface is effected in the following manner: the plate surface is wetted with the above-mentioned solution for 1 minute, followed by heat-treatment with IR- and UV-radiation together at the temperature of 220° C. for 12 seconds until the plate surface becomes black, whereafter the plate is rinsed with water.

The electrochemical building-up of the metal layer onto the ebonite plate surface is effected in a manner similar to that described in Example 1 hereinbefore.

As a result of electrochemical metallization, on the surface of the ebonite plate there is deposited a bright-pink layer. The adherence of the metal layer to the ebonite plate surface is 520–540 g/3 mm.

INDUSTRIAL APPLICABILITY

The solution for electrochemical metallization of dielectrics according to the present invention can be used mainly for the formation of a current-conducting layer on the dielectric surface prior to the subsequent electrochemical deposition of both functional and decorative metal coatings onto the surface of glass-cloth-base laminates, glass, ceramics, active coals, plastic powders, paper, fabric and various other dielectrics. The solution and process for electrochemical metallization of dielectrics according to the present invention finds an extensive use in the electrical engineering, household appliances, ship-building, aviation, car manufacture, instrument engineering and other industries; in particular, they can be used in metallization of through holes in one-side, two-side and multi-layered printed circuit boards.

We claim:

1. A process for producing a conductive layer on a dielectric consisting essentially of:

(a) wetting at least a portion of the surface of the dielectric with a solution comprising:

|  | grams/liter |
|---|---|
| copper salt | 50-350 |
| hypophosphorous acid salt | 50-350 |
| stabilizing agent | 0.004-250 |
| water | up to 1 liter |

(b) heat-treating at least the portion of the surface of the dielectric wetted with the solution at a temperature in the range of 80° to 350° C. to evaporate the water and decompose the solution whereby a conductive layer is formed.

2. A process of claim 1 wherein the heat-treating is carried out by irradiation with IR radiation.

3. A process of claim 2 wherein the conductivity of the conductive layer is increased by electroplating.

4. A process of claim 2 wherein the heat-treatment is at a temperature of from 220°-270° C.

5. A process of claim 4 wherein the heat-treating is done for a period of from 7 to 20 seconds.

6. A process of claim 4 wherein the conductivity of the conductive layer is increased by electroplating.

7. A process of claim 1 wherein the heat-treating is carried out by irradiation with IR and UV radiation.

8. A process of claim 7 wherein the conductivity of the conductive layer is increased by electroplating.

9. A process of claim 7 wherein the heat-treatment is at a temperature of from 180° to 220° C.

10. A process of claim 9 wherein the heat-treatment is carried out for 5 to 12 seconds.

11. A process of claim 9 wherein the conductivity of the conductive layer is increased by electroplating.

12. A process of claim 1 wherein the heat-treating is done for a period of less than about 10 minutes.

13. A process of claim 1 wherein the conductivity of the conductive layer is increased by electroplating.

* * * * *